United States Patent
Bistry (10) Patent No.: US 7,325,211 B1
(45) Date of Patent: Jan. 29, 2008

(54) CLOCK SKEW MODELLING USING DELAY STAMPING

(75) Inventor: Dina Bistry, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 217 days.

(21) Appl. No.: 11/219,287

(22) Filed: Sep. 2, 2005

(51) Int. Cl.
*G06F 17/50* (2006.01)

(52) U.S. Cl. .............................. 716/6; 716/5
(58) Field of Classification Search .............. 716/2, 716/4–6, 18
See application file for complete search history.

(56) References Cited

U.S. PATENT DOCUMENTS

| | | | | |
|---|---|---|---|---|
| 6,550,044 | B1 * | 4/2003 | Pavisic et al. ................. | 716/6 |
| 7,039,891 | B2 * | 5/2006 | Tetelbaum .................... | 716/13 |
| 7,096,442 | B2 * | 8/2006 | Lu et al. ........................ | 716/6 |
| 2005/0050497 | A1 * | 3/2005 | Tetelbaum .................... | 716/6 |
| 2005/0268263 | A1 * | 12/2005 | Sun et al. ...................... | 716/6 |
| 2006/0010408 | A1 * | 1/2006 | Auracher et al. ............. | 716/6 |

* cited by examiner

*Primary Examiner*—Jack Chiang
*Assistant Examiner*—Binh Tat
(74) *Attorney, Agent, or Firm*—Martine Penilla & Gencarella, LLP (57) ABSTRACT

A method for determining clock skew to avoid hold time violations is provided. The method includes obtaining a total delay to a source by adding a first delay associated with each of the delay elements in a clock tree path leading to a source. The method also includes obtaining a total delay to a destination by adding a second delay associated with each delay element in a clock tree path leading to a destination. Thereafter, a source sum delay of the delay elements in the clock tree path leading from the source to a common point is obtained. Similarly, a destination sum delay is obtained for the delay elements in the clock tree path from the destination to the common point. Subsequently, the actual delay to the source is obtained by subtracting the source sum delay from the total delay. Similarly, actual delay to the destination is obtained by subtracting the destination sum delay from the total delay. The skew value is then calculated by subtracting the actual delay to the source from the actual delay to the destination.

14 Claims, 6 Drawing Sheets

CLOCK SKEW MODELLING USING DELAY STAMPING

DESCRIPTION OF THE RELATED ART

Most of the electronic circuits today are digital circuits. Hold time violations often affect digital circuits. Circuits with flip-flops and latches are particularly prone to hold time violations. Hold time violations occur when a signal is not latched properly. In order for a signal to latch properly, the signal has to remain stable for certain duration i.e. hold time. If the signal changes too quickly, there will not be sufficient time for the signal to latch, which may lead to unpredictable operations.

One of the solutions is to include precautionary measures in the design itself. However, this solution is not infallible. Another proposed solution involves slowing down the signal propagation path. The signal propagation through the various circuit elements in the digital circuits is generally controlled by a clock signal, which originates at a clock. Clock signal propagation delay from a phase locked loop (PLL) to a memory element may vary from case to case. Clock skew occurs when there is difference in the clock signal arrival time between the circuit elements from which the signal is send and the circuit elements, which receive the signal. Clock skew is one of the factors that may lead to hold time violations. Therefore, it is necessary to determine what clock skew value should be used to detect hold time violations.

One of the existing ways to fix hold time violation is by margining the timing of the clock signal path. Margining ensures that the fast path is always faster or the slow path is slower under all process conditions. However, modifying clock delay is undesirable because it affects many memory elements, so while fixing one problem it might create another. Therefore, most of the existing solutions involve adding padding to slow the critical fast paths. The padding generally includes adding delays (buffers) to meet the worst-case clock skew requirement. However, detecting hold time violations based on the worst-case clock skew often results in a large number of false violations. Fixing large number of false violations or unreal large violations requires a larger number of buffers, which not only wastes area but also consumes additional power. This can also make design convergence difficult.

In view of the foregoing, there is a need for a method to determine the actual clock skew so that the actual skew may be used instead of the worst-case clock skew.

SUMMARY

Broadly speaking, the present invention fills these needs by providing a method and system that can determine hold time violations and their magnitude. The method calculates realistic clock skew for each path based on annotating (stamping) delays for each circuit element and wire in a clock path. The calculated skew value is used to determine realistic delay required to prevent hold time violations.

One aspect of the invention involves a method for determining clock skew to avoid hold time violations. The method includes obtaining a total delay to a source by adding a first delay associated with each delay element in a clock tree path leading to a source. The method further includes obtaining a total delay to a destination by adding a second delay associated with each delay element in a clock tree path leading to a destination. Thereafter, a source sum delay is obtained for each delay element in the clock tree path from the source to a common point in the clock tree. Similarly, a destination sum delay is obtained for each delay element in a clock tree path leading from the destination to the common point in the clock tree. The actual delay to the source is obtained by subtracting the source sum delay from the total delay. In the same way, the actual delay to the destination is obtained by subtracting the destination sum delay from the total delay. From the actual delay to the source and the actual delay to the destination, the skew value is calculated.

Another aspect of the invention involves a method for determining clock skew to avoid hold time violations. The method includes determining a common point. Next, a first and a second delay value is assigned to each of the delay elements in a clock tree path leading to a source from the common point. Thereafter, a first and a second delay value are assigned for each of the delay elements in a clock tree path leading to a destination from the common point. Then, an actual delay value to the source is calculated by adding the first delay values for the delay elements leading to the source. Similarly, an actual delay value to the destination is calculated by adding the second delay values for the delay elements in the clock tree path leading to the destination. The skew value is then calculated by subtracting the actual delay value to the source from the actual delay to the destination.

It should be appreciated that the present invention can be implemented in numerous ways, including as a process, an apparatus, a system, a device, or a method. Several inventive embodiments of the present invention are described below.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description like structural elements.

DETAILED DESCRIPTION

An invention for modeling realistic clock skew in a digital circuit is disclosed. The embodiments described herein help to minimize the number of false violations and reduce the magnitude of hold time violations associated with analysis based on worst-case clock skew assessment. In particular, the method and the system described herein can compute the skew precisely and detect hold time violations and their magnitude. The designers can take this realistic skew into account, during the design process of the digital circuits, and adjust the design accordingly. Thus, false violations and over estimated violations associated with clock skew models based on a worst-case skew can be eliminated.

Figure 1:
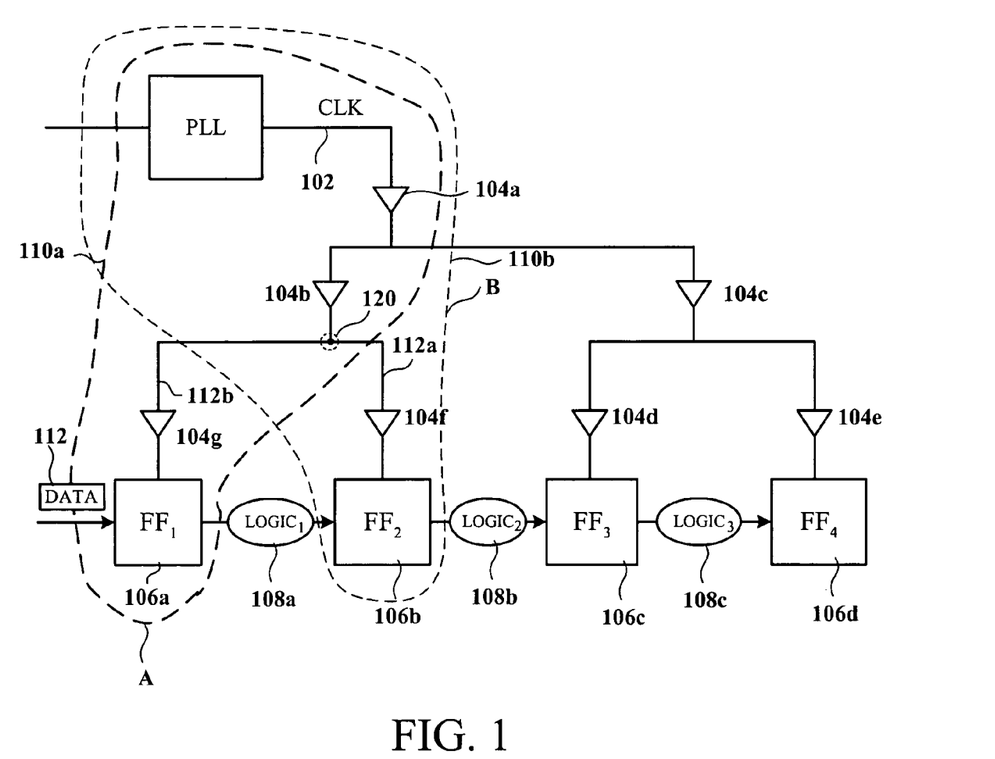
FIG. 1 shows a circuit clock tree in accordance with an embodiment of the present invention.

FIG. 1 shows a digital circuit clock tree in accordance with an embodiment of the present invention. FIG. 1 includes system clock 102, delay components 104a-104g, flip-flops 106a-106d, and logic elements 108a-108c. The system clock signal from the system clock 102 propagates through the delay components 104a-104g and reaches the flip-flops 106a-106d. The system represented by the digital circuit clock tree is synchronized according to the system clock 102. In one embodiment, the system clock 102 may be provided by a phase locked loop (PLL) based clock distribution. As shown, the clock signal propagates through delay element 104a and then branches off to delay components 104b and 104c. From 104b the clock signal travels to 104g and 104f. The clock signal then travels to memory element 106a from 104g and to memory element 106b from 104f. The path taken by the clock signal from clock 102 to memory element 106a is designated within the dotted lines 1 10a. Similarly, the path taken by the clock signal from clock 102 to memory element 106b is designated within the dotted lines 110b. One skilled in the art should appreciate that the delay components may be any electronic device that temporarily pauses, or slowdowns the propagation of the clock signal. In one embodiment each of the delay components 104a-104g may be an inverter. In another embodiment, each of the delay components 104a-104g may be a buffer.

Further shown in FIG. 1 are logic circuits 108a-108c. Logic circuits 108a-108c may represent any logic function to be realized by the digital circuit. Data 112 is latched on by flip-flop 106a at a first clock signal. At a subsequent clock signal, data 112 are transferred from flip-flop 106a to logic1 108a. The transfer of data 112 is controlled by the clock signal. There is a minimum time called the setup time in which the data 112 must be maintained at constant value prior to the occurrence of the next clock signal. Similarly, there is a definite time called the hold time during which the data must not change after the data being latched by the memory elements 106a-106d. Therefore, the clock signal may reach each of the memory elements 106a-106d at different time. The difference in arrival time is the clock skew and it affects the duration of hold time. Therefore, clock skew should be taken into account during hold time verification.

Accordingly, the present invention provides a method to detect possible corruption of the data through delay stamping, by annotating point-to-point delays for delay elements in the clock tree. The technique eliminates the need to apply a worst-case clock skew universally. Instead, the embodiments of the invention provide a method to calculate the realistic skew for each path based on the annotated delays.

Figure 2:
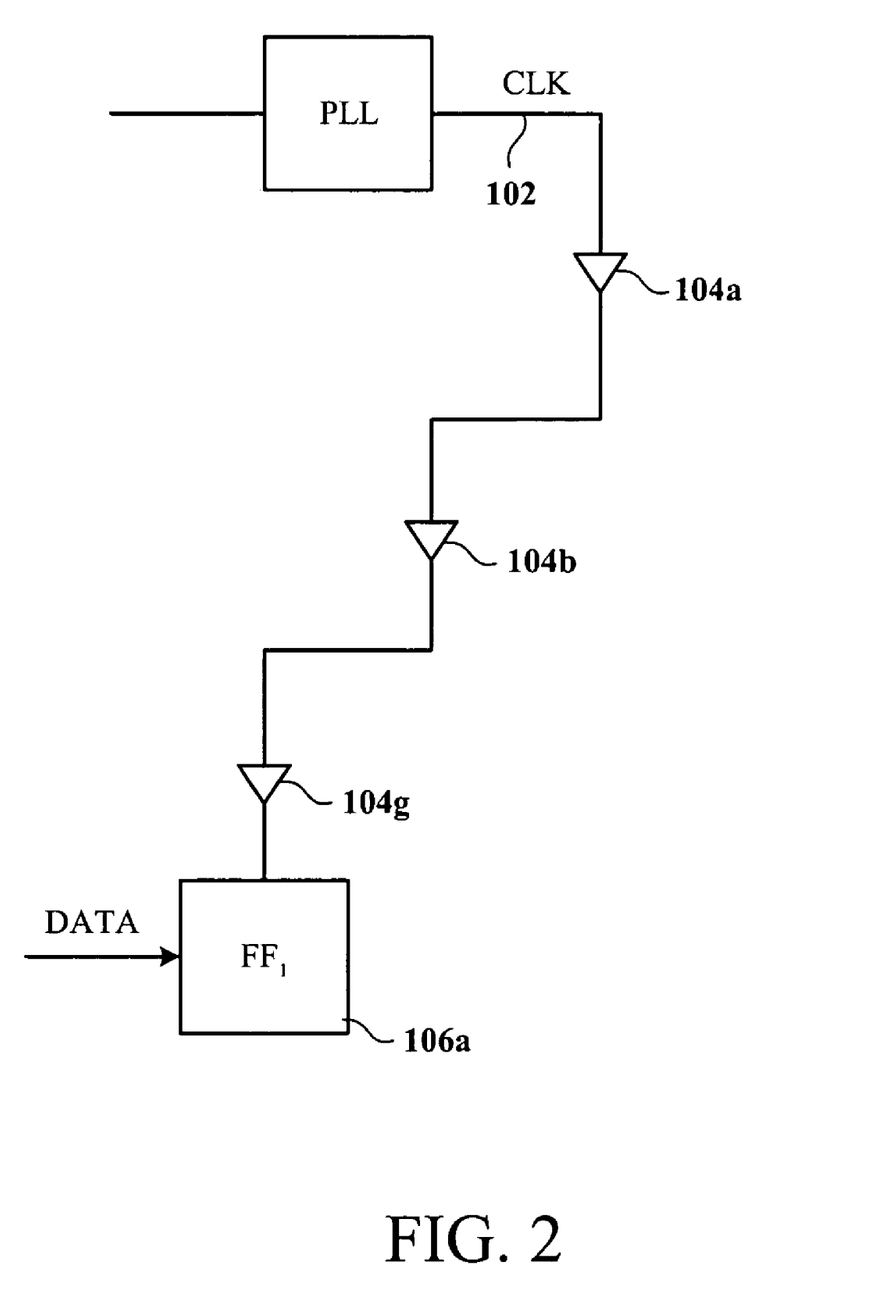
FIG. 2 shows one of the clock tree paths illustrated in FIG. 1 in accordance with an embodiment of the present invention.
Figure 3:
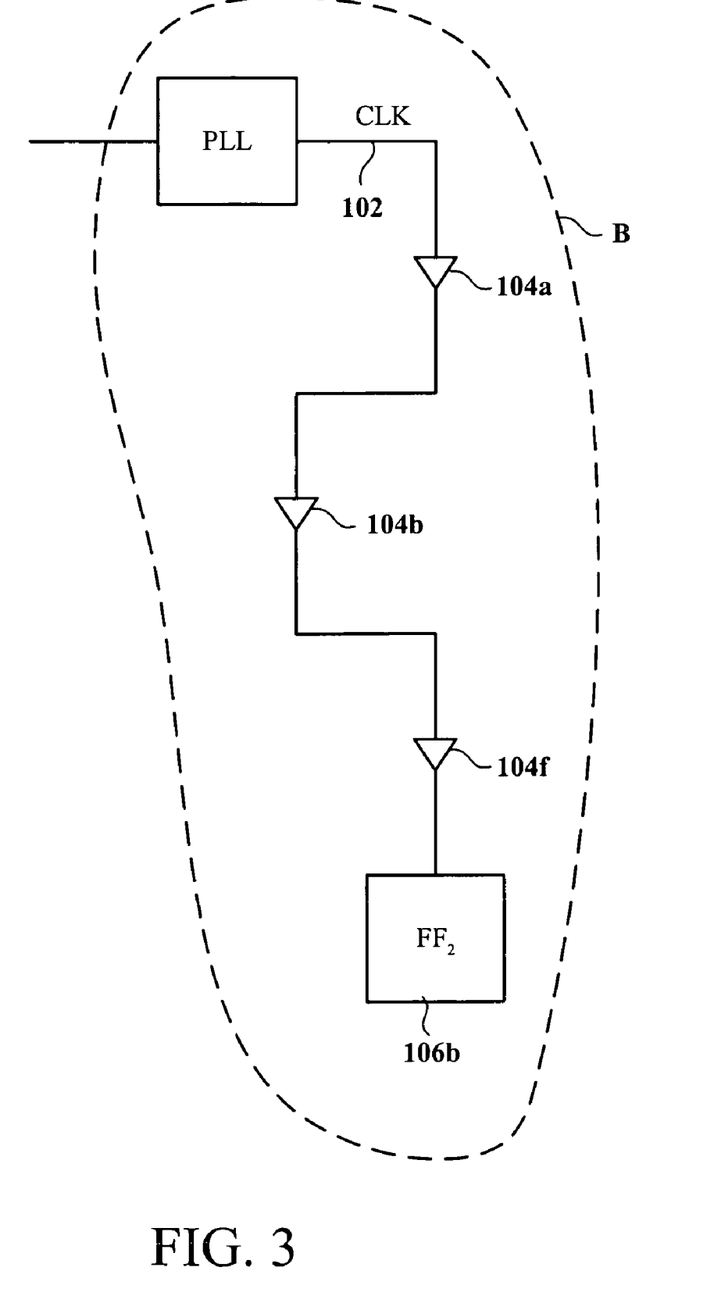
FIG. 3 shows a second clock tree path illustrated in FIG. 1, in accordance with an embodiment of the present invention.

FIG. 2 shows path 110a illustrated in FIG. 1. Path 110a starts at system clock 102 and includes delay components 104a, 104b, 104g and ends at memory element 106a. Similarly, FIG. 3 shows path 110b illustrated in FIG. 1. Path 110b starts at system clock 102 and includes delay components 104a, 104b, and 104f and ends at memory element 106b. The embodiments of the present invention provide a way to calculate the realistic skew for each of the data paths 110a and 110b.

Figure 4:
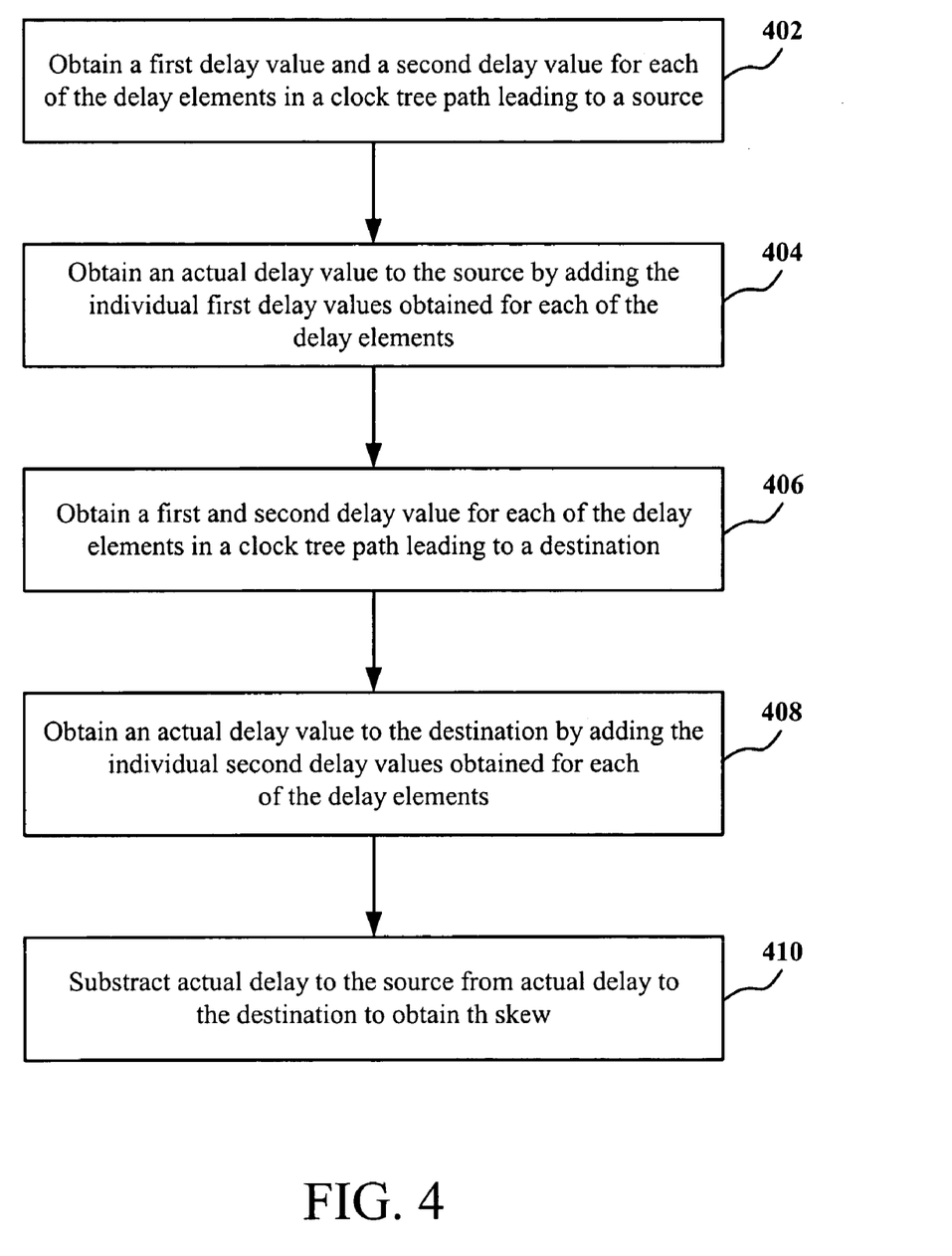
FIG. 4 is a flow chart illustrating the method of operations involved in determining the actual clock skew in a digital circuit to avoid hold time violations in accordance with an embodiment of the present invention.

FIG. 4 is a flow chart illustrating the method of operations involved in determining the actual system clock skew in accordance with an embodiment of the present invention. The method is initiated in operation 402, where a first delay value and a second delay value for each of the delay elements in the clock tree path leading to a source from the PLL are obtained. The two delay values may be assigned to each of the delay elements such that there is a delay range designated for each of the delay elements. In one embodiment, the first delay value is the fastest delay for each of the delay elements in the clock tree path. As described above, source is the memory element from which the data are transferred and the destination is the memory element, which receives the transferred data. The source and the destination are sequentially adjacent to each other. Additionally, the source and the destination can be interchanged. In some instances, the data received by the destination may be transferred to the next sequentially adjacent memory element.

In such instance, the destination, which initially received the data, becomes a source and the sequentially adjacent memory element, which will receive the data subsequently, becomes the destination.

Thereafter in operation 404, an actual delay to the source is obtained by adding the individual first delay values obtained for each of the delay elements in the clock tree path leading to the source. Similarly, a first and second delay values are obtained for each of the delay elements in the clock tree leading to the destination from the PLL as shown in operation 406. In operation 408 an actual delay to the destination is obtained by adding the individual second delay values obtained for each of the delay elements. In one embodiment, the second delay value is the slowest delay for each of the delay elements in the clock tree path. The skew is obtained in operation 510 by subtracting the actual delay to the source from the actual delay to the destination. As described above, the skew obtained through this method comes very close to the actual skew, thus the number of false violations can be minimized through this method.

Figure 5:
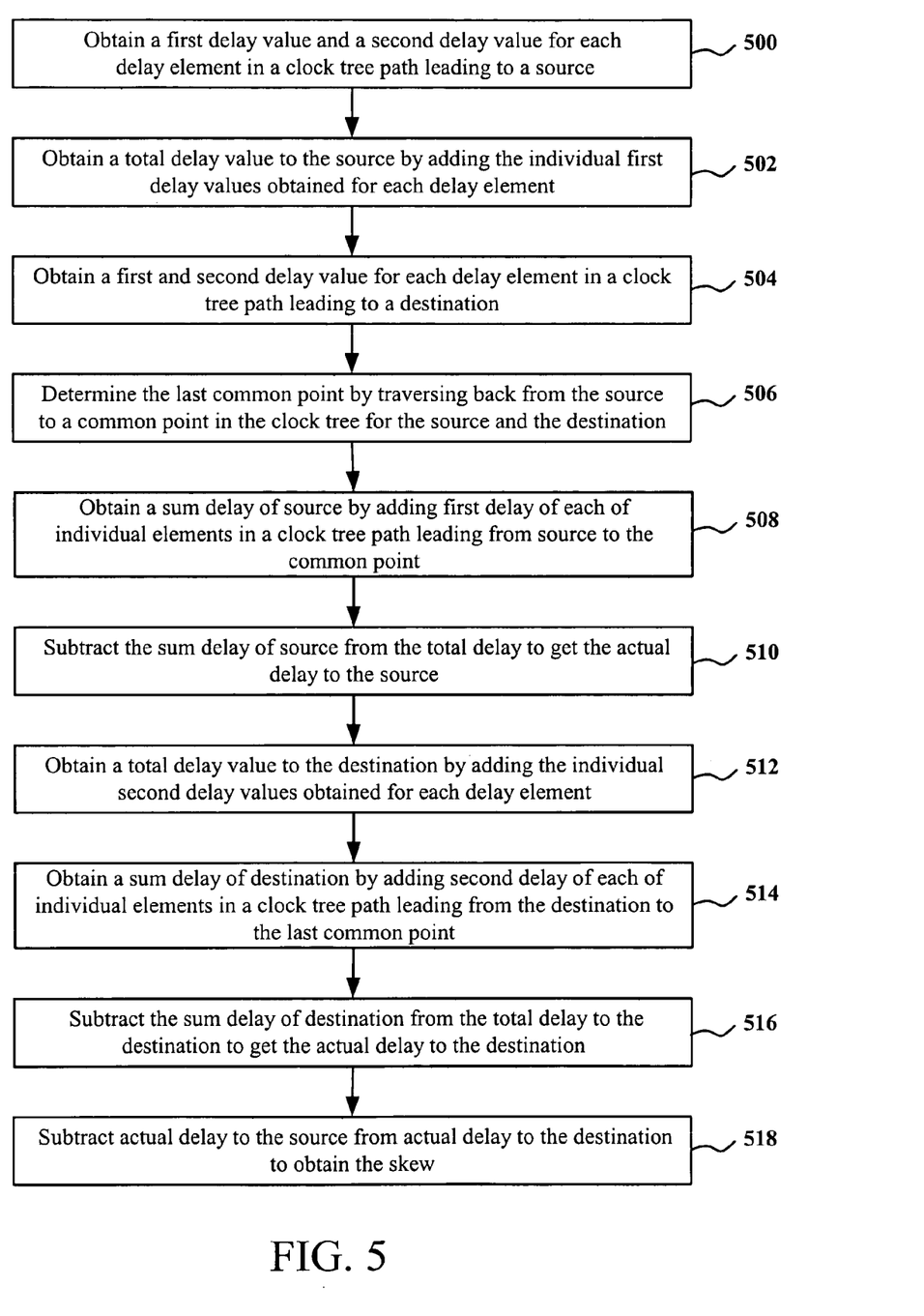
FIG. 5 is another flow chart illustrating the method of operations involved in determining the actual system clock skew in accordance with another embodiment of the present invention.

FIG. 5 is a flow chart illustrating the method of operations involved in modeling clock skew for hold time verification in accordance with an embodiment of the present invention. The method associated with FIG. 5 uses a common point to model the actual skew. The method is initiated in operation 500 where a first delay value and a second delay value for each of the delay elements in a clock tree path leading to a source is obtained. One skilled in the art should understand that delay elements may include buffers, inverters, wires, etc. A source as described herein is a memory element from which data are being transferred. In one embodiment, the memory element is a flip-flop. The destination is the sequentially adjacent memory element, which receives the data that were transferred from the source.

The first and second delay values for each of the delay elements described above represent a range for the delay value for the delay elements. The delay values are assigned to each of the delay elements and can vary within a range. The delay values may be initially calculated from data provided by the manufacturer. For example, in case of a wire, the delay may be calculated based on the length of the wire and the material that is being used to manufacture the wire. As the design process progresses, more accurate delay values may be obtained using simulation or other methods and the actual values may be used to calculate the skew. The skew value determines the delay required between any two sequentially adjacent memory elements such that the latest data signal must arrive and be latched within the destination memory element before the earliest data signal generated with the next clock pulse arrives.

Then in operation 502, a total delay value to the source is calculated by adding the individual first delay values for each of the delay elements in the clock tree path leading to the source. In one embodiment, the total delay value to the source is calculated using the fastest delay value for each of the delay elements in the clock tree. Similarly in operation 504, a first and second delay values are obtained for each of the delay elements in a clock tree path leading to a destination. Destination as described here in is a memory element to which the data are transferred from the source. In one embodiment, the memory element is a flip-flop. As described previously, the first and second delay values are assigned to the delay elements and the first and second values are determined using various methods.

Thereafter, in operation 506, the last common point is determined by traversing the clock tree path from the source to the last common point for the source and the destination. A sum delay of source is obtained by adding first delay for each of the individual delay elements from the source to the last common point in operation 508. The common point as described herein is a circuit node that is common for the different signal paths. For example, in FIG. 1, the common point for path 110a and 110b is the point 120. Then, in operation 510, the sum delay of source is subtracted from the total delay to get the actual delay to the source. Similarly, a total delay value is calculated for the clock tree path leading to the destination using the second delay values obtained for each of the delay elements as indicated in operation 512. In one embodiment, the second delay value is the slowest delay for each of the delay elements in the clock tree path leading to the destination. Subsequently, in operation 514, a sum delay of destination is calculated by adding a second delay for each of individual elements in a clock tree path leading from destination to the last common point. Then, the actual delay to the destination is determined by subtracting the sum delay of destination from the total delay to the destination as shown in operation 516. Once the actual delay to the source and the actual delay to the destination are determined, by subtracting the two the actual skew of the system clock can be determined in operation 518.

Figure 6:
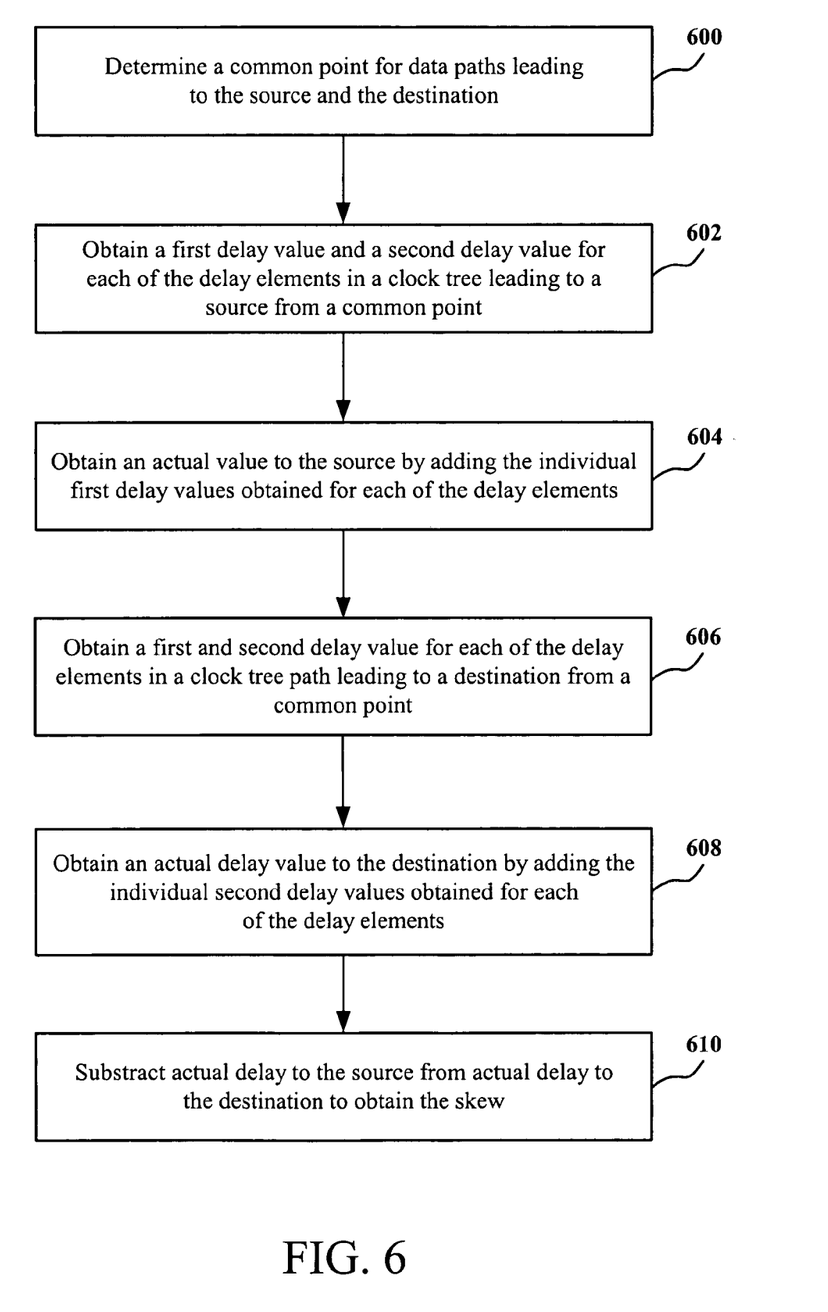
FIG. 6 is a flow chart illustrating the method of operations involved in determining the actual system clock skew using a common point, in accordance with an embodiment of the present invention.

FIG. 6 is a flow chart illustrating the method of operations involved in determining the actual system clock skew using a common point in accordance with an embodiment of the present invention. The method is initiated operation 600 where a last common point to the source and the destination is determined. The last common point to the source and the destination may be determined by traversing, as described above, or going down the clock tree path from PLL and finding the last node that is common to the source and the destination. Thereafter in operation 602, a first delay value and a second delay value for each of the delay elements in the clock tree path leading to a source from the last common point are obtained. Then in operation 604, an actual delay to the source is obtained by adding the individual first delay values obtained for each of the delay elements in the clock tree path leading to the source from the last common point. Similarly, a first and second delay values are obtained for each of the delay elements in the clock tree leading to the destination from the last common point in operation 606. In operation 608, an actual delay to the destination is obtained by adding the individual second delay values obtained for each of the delay elements. The skew is obtained in operation 610 by subtracting the actual delay to the source from the actual delay to the destination. As described above, the skew obtained through this method comes very close to the actual skew, thus the number of false violations can be minimized through this method.

As can be seen, this method individually annotates the actual delay associated with each delay element in the digital circuit. This provides the actual value of the skew rather than the worst-case skew. The skew can be used to determine the actual delay required to prevent hold time violations. The actual delay must be greater than the hold time plus the skew. One skilled in the art should understand that even though the actual delay is shown to be calculated based on the hold time, the set up time may also be used to calculate the actual delay.

To illustrate the method further, sample delay values are used to calculate the skew for the paths 110a and 110b of FIG. 1 using the method described with respect to FIG.

The delay values for each of the delay elements are obtained from the last common point 120 to memory element 106a and memory element 106b. For example, the first and second delay values assigned to wires 112a and 112b are 80-93 pS and 75-92 pS respectively. Similarly, the delay values assigned to delay components 104f and 104g are in the range of 25-30 pS and 22-29 pS respectively. Since the data signal 112 travels from memory element 106a to 106b, memory element 106a is considered to be the source and the memory element 106b is considered to be the destination. Therefore, the actual delay to the source is calculated by adding the first delay for each of the delay elements to the source. In this case, the actual delay to the source 106a would be 75+22=97 pS. Similarly, the actual delay to the destination is obtained by adding the second delays to the destination. In this example, the actual delay to the destination 106b is 93+30=123 pS. The skew in this instance would be 123−97=26 pS. Therefore, according to this example, the logic delay between memory elements 106a and 106b should be greater than the hold time+skew. In this case, the skew is 26 pS.

With the above embodiments in mind, it should be understood that the invention may be practiced with other computer system configurations including hand-held devices, microprocessor systems, microprocessor-based or programmable consumer electronics, minicomputers, mainframe computers and the like. Furthermore, the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer-readable code on a computer-readable medium. The computer-readable medium is any data storage device that can store data which thereafter be read by a computer system. The computer-readable medium can also be distributed over a network coupled computer systems so that the computer-readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for determining clock skew to avoid hold time violations, comprising:
   obtaining a total delay from a clock generator to a source by adding a first delay associated with each delay element in a clock tree path leading to the source;
   obtaining a total delay from the clock generator to a destination by adding a second delay associated with each delay element in a clock tree path leading to the destination;
   obtaining a source sum delay of the delay elements in the clock tree path from the source to a common point;
   obtaining a destination sum delay of the elements in the clock tree path from the destination to the common point;
   subtracting the source sum delay from the total delay to the source to obtain an actual delay to the source;
   subtracting the destination sum delay from the total delay to the destination to obtain an actual delay to the destination; and
   obtaining a skew value by subtracting the actual delay to the source from the actual delay to the destination,
   wherein the source is a memory element from which data are transferred and the destination is a memory element, which receives the transferred data from the source, and the common point is a closest common point from the source and the destination in the clock tree path between the clock generator and the source, and the clock generator and the destination.

2. A method of claim 1, further comprising:
   assigning a first and second delay to each of the delay elements in the clock tree path to the source and the destination, wherein the first delay being a shorter delay and the second delay being a longer delay.

3. A method of claim 1, further comprising:
   maintaining a logic delay between memory elements greater than a hold time of a memory element plus the skew.

4. A method of claim 1, wherein the source and the destination are memory elements.

5. A method of claim 1, wherein the source and destination are sequentially adjacent.

6. A method of claim 1, wherein the destination receives data signal from the source.

7. A method of claim 1, wherein obtaining the source sum delay includes,
   determining the common point;
   traversing back from the source to the common point; and
   adding delay values associated with the delay elements in the clock tree path from the source to the common point.

8. A method of claim 1, wherein obtaining the destination sum delay includes,
   determining the common point;
   traversing back from the destination to the common point; and
   adding delay values associated with the delay elements in the clock tree path from the destination to the common point.

9. A method for determining clock skew to avoid hold time violations comprising:
   determining a common point, the common point is a closest common point from a source and a destination in a clock tree path between a clock generator and the source, and the clock generator and the destination;
   assigning a first and second delay value for each of the delay elements in a clock tree path leading to a source from the common point;
   assigning a first and second delay value for each of the delay elements in a clock tree path leading to a destination from the common point;
   obtaining an actual delay value to the source by adding the first delay values to the source;
   obtaining an actual delay value to the destination by adding the second delay values to the destination; and
   obtaining a skew value by subtracting the actual delay value to the source from the actual delay value to the destination,
   wherein the source is a memory element from which data are transferred and the destination is a memory element which receives the transferred data from the source.

10. A method of claim 9, wherein the common point is a circuit node that is common for the adjacent clock tree paths.

11. A method of claim 9, wherein maintaining a logic delay between memory elements greater than a hold time of the memory elements plus the skew value.

12. A method of claim 9, wherein configuring the skew value to synchronize a clock signal to memory elements.

13. A method of claim 9, further comprising:
    adjusting the first and second delay values according to simulation result.

14. A method for determining clock skew to avoid hold time violations comprising:
    obtaining a first and second delay value for each of the delay elements in a clock tree path leading to a source from a common point;
    assigning a first and second delay value for each of the delay elements in a clock tree path leading to a destination from the common point;
    obtaining an actual delay value to the source by adding the first delay values from a clock generator to the source;
    obtaining an actual delay value to the destination by adding the second delay values to from the clock generator the destination; and
    obtaining a skew value by subtracting the actual delay value to the source from the actual delay value to the destination,
    wherein the source is a memory element from which data are transferred and the destination is a memory element which receives the transferred data from the source, and the common point is a closest common point from the source and the destination in the clock tree path between the clock generator and the source, and the clock generator and the destination.

* * * * *